United States Patent [19]
Gayles

[11] Patent Number: 6,078,196
[45] Date of Patent: Jun. 20, 2000

[54] DATA ENABLED LOGIC CIRCUITS

[75] Inventor: Eric S. Gayles, Milpitas, Calif.

[73] Assignee: Intel Corporation, Santa Clara, Calif.

[21] Appl. No.: 08/932,751

[22] Filed: Sep. 17, 1997

[51] Int. Cl.$^7$ ...................... H03K 19/094; H03K 19/20; H03K 19/096; H03K 19/00
[52] U.S. Cl. .................... 326/121; 326/58; 326/98
[58] Field of Search ................... 326/21, 93, 113, 326/83, 57, 81, 95, 98, 112, 119, 121 OR, 58

[56] References Cited

U.S. PATENT DOCUMENTS

| | | | |
|---|---|---|---|
| 5,134,316 | 7/1992 | Ta ............................................... | 326/83 |
| 5,258,665 | 11/1993 | Ward et al. ................................ | 326/21 |
| 5,543,735 | 8/1996 | Lo ............................................. | 326/93 |
| 5,777,491 | 7/1998 | Hwang et al. ........................... | 326/113 |

*Primary Examiner*—Michael Tokar
*Assistant Examiner*—Patrick Wamsley
*Attorney, Agent, or Firm*—Raymond J. Werner

[57] ABSTRACT

Data enabled complex logic gates provide improved speed/power performance over conventional topologies such as static logic or clocked domino logic. Within a data enabled complex logic gate, complementary parallel logic structures, such as NFET logic trees, are configured such that for any combination of input variables one logic structure will produce a logic low as an output and the other logic structure will produce a logic high as an output. The logic structures are cross-coupled to each other by way of internal precharge devices, and are further individually coupled to an output latch. In this way the logic structures can be precharged to prepare for evaluation of the next set of input signals while the output latch maintains the result of the previous evaluation. In a further aspect of the invention, data enabled complex logic gates are combined with pass gate latches and multiplexer based logic gates to produce a high-speed, low-power logic pipeline.

7 Claims, 6 Drawing Sheets

DATA ENABLED LOGIC CIRCUITS

BACKGROUND OF THE INVENTION

1. Field of the Invention

The invention relates to integrated circuit design generally, and more particularly to Complementary Metal Oxide Semiconductor (CMOS) high performance, complex logic structures.

2. Background

Advances in semiconductor process technology and digital system architecture have led to requirements for integrated circuits to have increased operating frequencies. Unfortunately, higher operating frequencies result in undesirable increases in power consumption. Power consumption is a significant problem in integrated circuit design generally, and particularly in large, high speed products such as processors and microprocessors.

Circuit topologies such as clocked domino and differential cascode voltage switch (DCVS) logic have been developed to reduce the power otherwise consumed by conventional static logic.

Nonetheless, the trend of integrating more function on a single substrate while operating at ever higher frequencies goes on unabated.

What is needed is a circuit topology suitable for high speed operation while consuming less power than clocked domino or DCVS logic topologies.

SUMMARY OF THE INVENTION

Briefly, data enabled complex logic gates provide improved speed/power performance over conventional circuit topologies such as static logic or clocked domino logic. Within a data enabled complex logic gate, complementary parallel logic structures, such as NFET logic trees, are configured such that for any combination of input variables, one logic structure will produce a logic low as an output and the other logic structure will produce a logic high as an output. The logic structures are individually coupled to an output latch, and to precharge devices. In this way the logic structures can be precharged to prepare for the evaluation of the next set of input signals while the output latch maintains the result of the previous evaluation.

In a further aspect of the present invention the logic structures are cross-coupled to each other by way of internal pull-up devices.

In a still further aspect of the invention, data enabled complex logic gates are combined with pass gate latches and multiplexer based logic gates to produce a high speed low power logic pipeline.

DETAILED DESCRIPTION

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu), or an alloy of Al and copper, are conductors that provide signal paths for coupling or interconnecting, electrical circuitry. Other suitable metals may be used. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

In the field of digital circuit technology generally, reset refers to bringing an output node to a logical low, or zero. However, with respect to a data enabled complex logic gate in accordance with the present invention, reset refers to bringing an internal output node to the "non-evaluate" state. That is, an internal output node having an NFET evaluate path will reset to a high level, but an internal output node having an PFET evaluate path will reset to a low level.

Data enabled complex logic gate is also referred to herein as data enabled complex gate.

NFET refers to an n-channel field effect transistor and PFET refers to a p-channel field effect transistor.

Overview

A circuit topology according to the present invention allows the implementation of high speed pipeline stages without the use of clocked logic. The elimination of clocked logic reduces the clock load and therefore reduces power consumption of a chip. Additionally, the circuit topology according to a further aspect of the present invention enables selected pipeline segments to operate at twice an on-chip clock frequency without the requirement of a 2×clock.

Embodiments of the present invention use a combination of complex gate topology, pass-gate latching, and multiplexer based logic gates to achieve high speed evaluation.

Data Enabled Complex Logic Gate—Circuit Configuration

Figure 1:
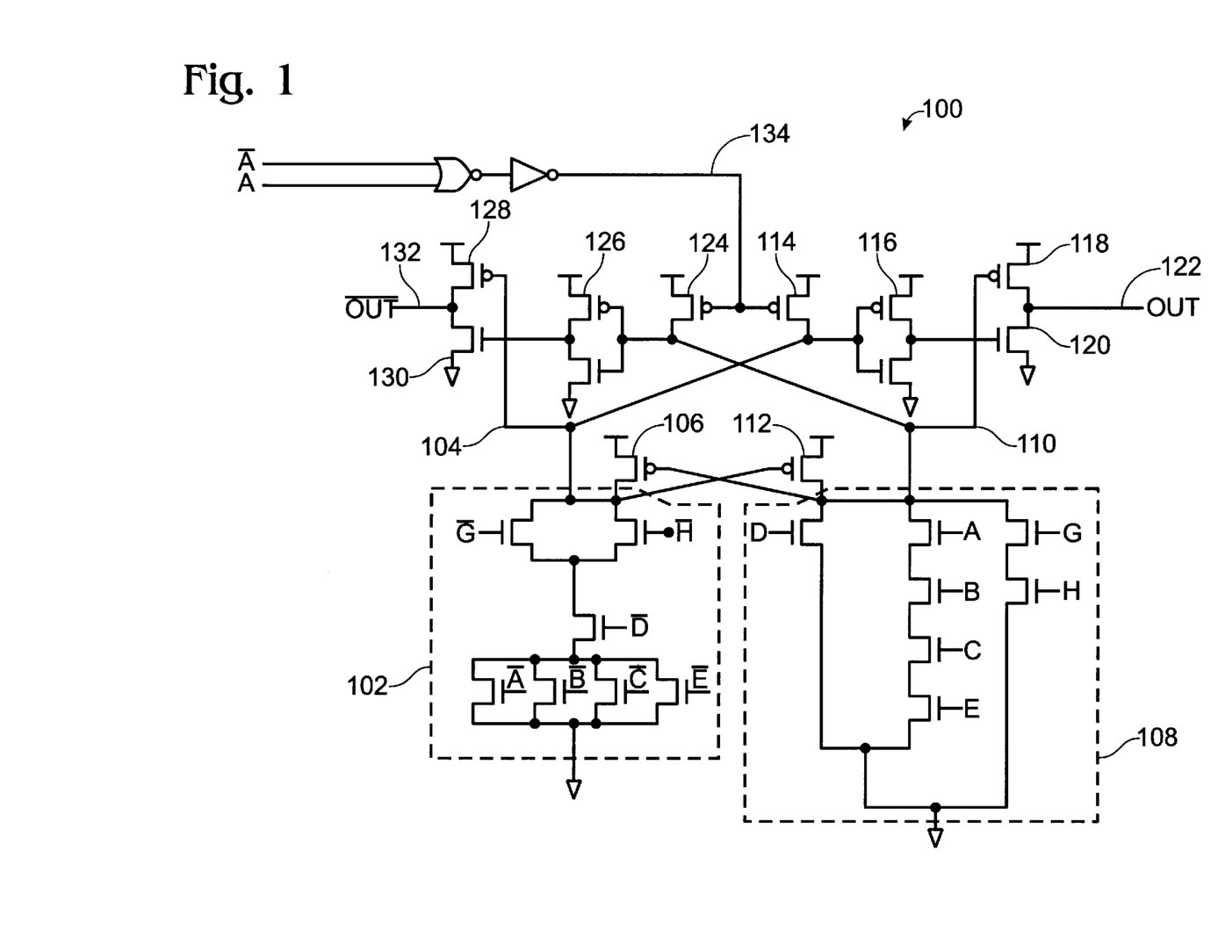
FIG. 1 is a transistor-level schematic of a data enabled complex logic gate in accordance with the present invention.
Figure 2A:
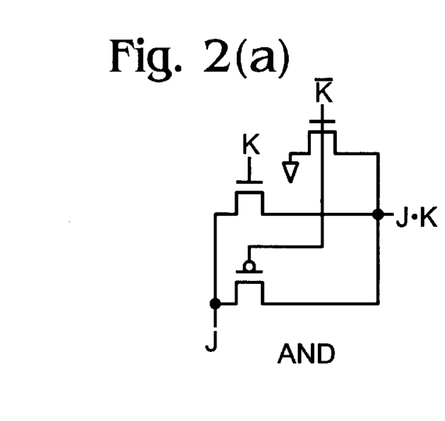
FIGS. 2(a)–(f) are transistor-level schematics of multiplexer logic gates in accordance with one embodiment of the present invention.
Figure 2B:
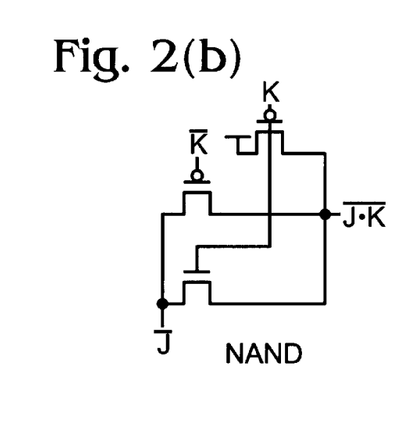
Figure 2C:
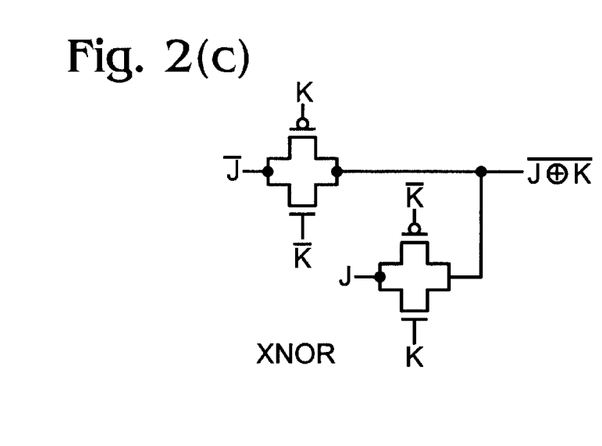
Figure 2D:
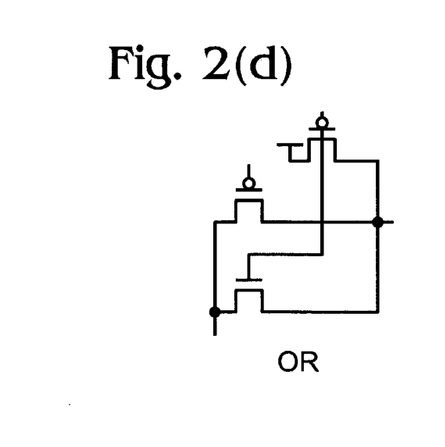
Figure 2E:
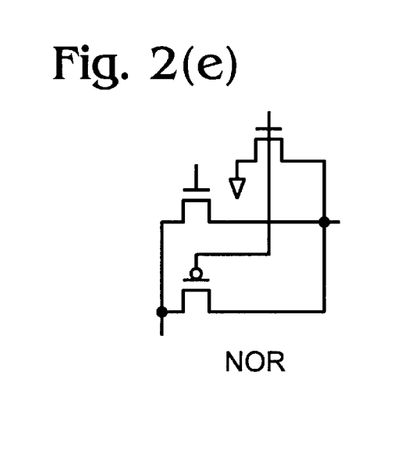
Figure 2F:
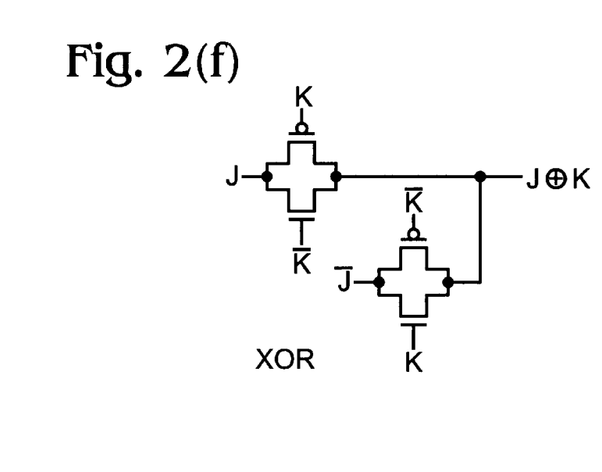

FIG. 1 shows an example of a data enabled complex gate 100. This gate topology allows the merger of several small logic gates into a single larger gate without a loss of performance.

Data enabled complex gate 100 includes a first NFET tree 102, having an output referred to as an internal output node 104, and further having a PFET pull-up 106 coupled to internal output node 104. More particularly, PFET pull-up 106 has a source coupled to a positive voltage supply, and a drain coupled to internal output node 104.

Data enabled complex gate 100 includes a second NFET tree 108, having an output referred to as an internal output node 110, and further having a PFET pull-up 112 coupled to internal output node 110. More particularly, PFET pull-up 112 has a source coupled to a positive voltage supply, and a drain coupled to internal output node 110.

NFET trees 102, 108 may be referred to more generally as logic structures.

PFET pull-up 106 has a gate that is coupled to internal output node 110 of second NFET tree 108. PFET pull-up 112 has a gate that is coupled to internal output node 104 of first NFET tree 102. PFET pull-ups 106, 112 are typically minimum width devices.

Although PFETs are preferred as pull-up devices in the illustrative embodiment described herein, pull-ups may be made from circuit elements other that PFETs. For example NFETs may be used as pull-up devices.

Data enabled complex gate 100 further includes latching circuitry that isolates the precharge of internal output nodes 104, 110 from the final output nodes of data enabled complex gate 100. The latching circuitry includes a first PFET 114 coupled source-to-drain between a positive voltage supply and internal output node 104. Internal output node 104 is further coupled to the input of an inverter 116. The output of inverter 116 is coupled to the gate of an NFET 120. NFET 120 is coupled drain-to-source between final output node OUT 122 and ground. A PFET 118 is coupled source-to-drain between a positive voltage supply and final output node OUT 122. The gate of PFET 118 is coupled to internal output node 110 of second NFET tree 108. Together, PFET 118 and NFET 120 form a tristate buffer. The latching circuitry further includes a second PFET 124 coupled source-to-drain between a positive voltage supply and internal output node 110. Internal output node 110 is further coupled to the input of an inverter 126. The output of inverter 126 is coupled to the gate of an NFET 130. NFET 130 is coupled drain-to-source between final output node OUT-bar 132 and ground. A PFET 128 is coupled source-to-drain between a positive voltage supply and final output node OUT-bar 132. The gate of PFET 128 is coupled to internal output node 104 of first NFET tree 102. Together, PFET 128 and NFET 130 form a tristate buffer. Data is stored at final output nodes OUT 122, and OUT-bar 132, in the form of charge stored on the capacitance associated with those nodes.

The gates of PFETs 114, 124 are coupled to node 134. In the illustrative embodiment of the present invention shown in FIG. 1, node 134 is coupled to the output of logic that is operable to signal the period during which the tristate buffers are to be in a high impedance state.

Data Enabled Complex Logic Gate—Circuit Operation

The basic operational flow of a data enabled complex gate is as follows:

1) Signals coupled to the input terminals of each logic structure are all driven to an inactive state. For logic structures comprised of NFET trees, the inactive state is a logic low, also commonly referred to as a logic zero;

2) Subsequently, the output nodes of the logic structures are precharged. For logic structures comprised of NFET trees, the output nodes are precharged to a logic high, also commonly referred to as a logic one;

3) Subsequent to precharging the output nodes of the logic structures, the signals coupled to the input terminals of each logic structure are released from the inactive state so that each of these signals goes to a logic one or zero in accordance with the operational state of the various signals;

4) By virtue of their physical configuration, described above, one of the complementary logic structures will discharge its respective output node when the input signals are released from the inactive state, while the other logic structure will substantially maintain its output node at the precharged state;

5) The logic structure output nodes drive the latching circuitry to which they are coupled (as described above) so that the final output nodes of the data enabled complex gate reflect the result of the logical evaluation of the state of the input signals; and 6) Steps 1–5 of this process may then be repeated.

Those skilled in the art will recognize that various ones of the enumerated steps above may be overlapped in time to some degree.

To understand the basic operation of the gate, it should be recognized that the input terminals of the data enabled complex gate must be driven to an inactive state at the beginning of the half cycle. The manner in which the gate inputs are driven to an inactive state is described below. In the illustrative embodiment of the present invention described herein, the inactive state is a logic zero.

Once the pipeline stage is enabled, typically by a state transition of a clock signal, some subset of the inputs rise, exactly one signal for each (x, not(x)) pair. Prior to this time, outputs 104, 110 of NFET trees 102, 108 are precharged high. Once the input signals are released from the inactive state, one of NFET trees 102, 108 discharges its output node. This discharge sets the final output nodes 122, 132, pulling one output high while pulling the other output to ground.

At a predetermined time after the release of the input signals from the inactive state, the inputs to the data enabled complex gate are all reset to the inactive state, which is a zero in the illustrative embodiment. This causes outputs 104, 110 of NFET trees 102, 108 to reset (i.e., precharge) to a logic high. A feature of this gate is that while outputs 104, 110 are resetting, final output nodes 122, 132 retain their values. Therefore, the rest of the pipeline segment is not affected by the resetting of the internal portion of data enabled complex gate 100.

Charge sharing does not present the same threat in embodiments of the present invention as it does in domino or any of the current switch logic topologies. For every input combination, one of the logic structures will completely discharge its output node. The circuitry between the completely discharged node and the final output nodes of data enabled complex gate 100 propagates the signal. If the other network partially discharges its output slightly below Vcc because of charge sharing, only marginal noise is introduced to the output signals. The partially discharged, or corrupt, HIGH value drives an inverter that generates a corrupt LOW as a result. The corrupt HIGH also drives a PFET, slightly turning on the PFET. The drain of this PFET is connected to the drain of an NFET that is fully conducting to ground because the gate of the NFET is driven by a true HIGH. Therefore, the output value is correct. On the other side of the gate, the corrupt LOW drives an NFET, partially turning it on. However, a true LOW drives the adjacent PFET, allowing it to conduct completely to Vcc. Therefore, this output is also correct. NFET trees 102, 108 are cross-coupled with minimum sized PFETs 106, 112 to further negate the effects of charge sharing.

The speed advantage a data enabled complex gate offers to the entire circuit is that a single NFET-based gate can be equivalent to two or more simple two-input gates. A worst case path through a series of simple gates suffers from two primary problems. The first is the poor conducting performance of PFETs relative to NFETs. The second is the parasitic capacitance and resistance associated with inter-gate routing. A single data enabled complex logic gate avoids both of these problems.

A data enabled complex logic gate does not require a clock. This both reduces the clock load and allows the gate to operate at the speed that it receives data. The reduced clock load helps reduce power consumption. Additionally, limiting precharge to nodes internal to the gate, rather than precharging interconnect lines and associated parasitic capacitances as well, further reduces power consumption.

Multiplexer Based Logic

FIGS. 2(*a*)–(*f*) show the set of gates for multiplexer based logic according to one embodiment of the present invention. Alternating multiplexer based logic gates with static logic gates along a pipeline provides reduced delay when compared to either all static logic chains, or domino logic chains with two input gates. The multiplexer based logic gates are typically not coupled in series with each other because they do not have their own current source. Typically, the first gate of a pipeline stage embodying the present invention is a data enabled complex gate. After a data enabled complex gate, every gate in an odd logic level is a multiplexer gate. Every gate in a non-zero even logic level is a static CMOS two input logic gate. The restriction to two input CMOS logic gates ensures that there will be sufficient drive though the multiplexer gates. It also ensures that the slopes of the inputs will be sharp enough to avoid hot electron degradation of the multiplexer gates.

Data enabled complex gate circuits, and multiplexer based logic gates each are a dual-rail topology. Therefore, each static and multiplexer gate is actually a gate pair generating complementary outputs.

Multiplexer based logic gates provide several speed advantages over conventional static CMOS logic gates. For example, XOR logic can be realized as a single gate with low effective resistance. In addition, multiplexer based logic gates merge well with data enabled complex gates due to the relatively high current drive provided by the output nodes of a data enabled complex logic gate.

Reset Low Pulsed Latches and Double Edge-Triggered Flip-Flops

Figure 3A:
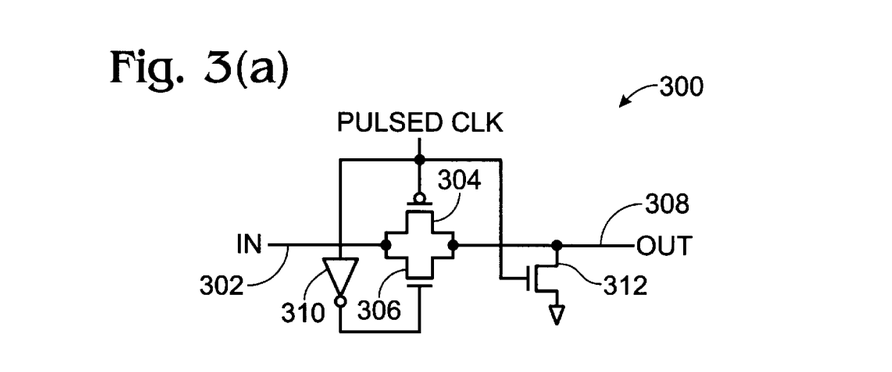
FIG. 3(a) is a schematic of a reset low pulsed latch in accordance with one embodiment of the present invention.
Figure 3B:
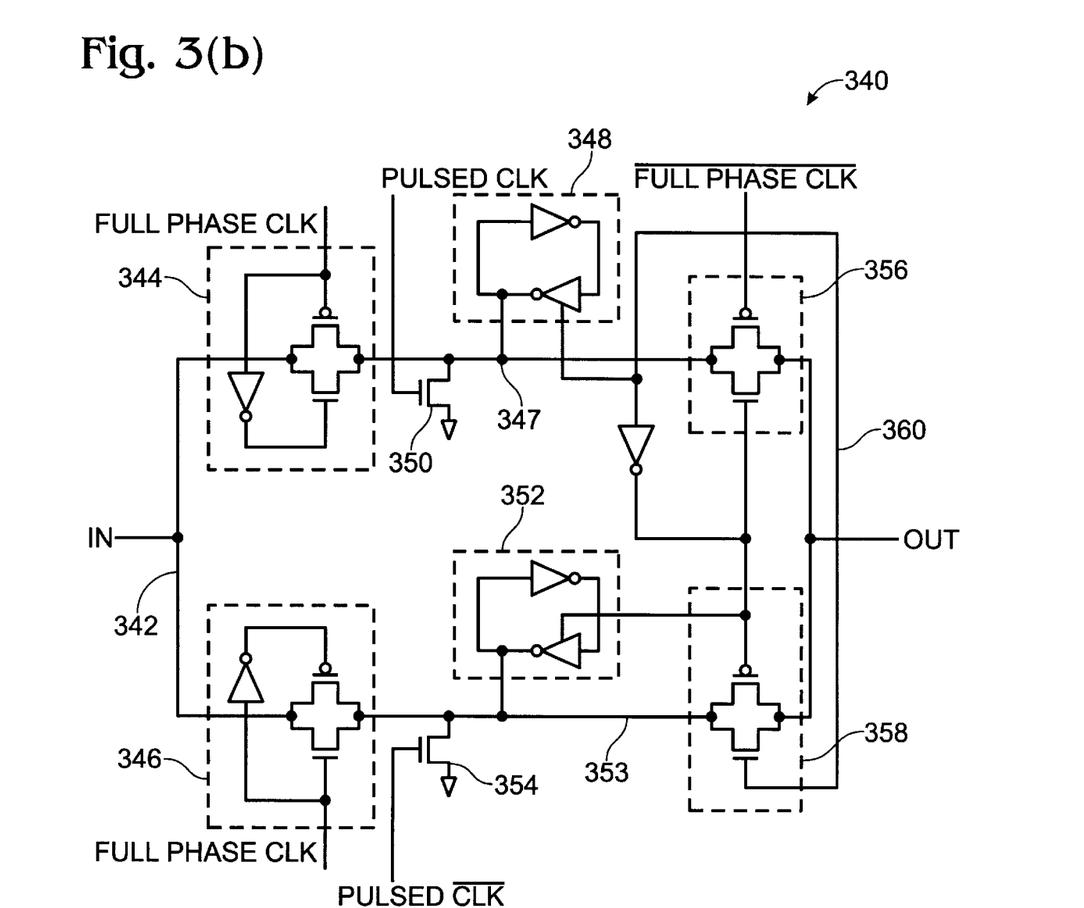
FIG. 3(b) is a schematic of a reset low pulsed double edge triggered flip-flop in accordance with one embodiment of the present invention.

FIGS. 3(*a*)–(*b*) show examples of circuits that ensure that the data enabled complex logic gate inputs are driven to an inactive state prior to the evaluation phase. That is, the signals that are coupled to the input terminals of logic structures 102, 108, are driven to an inactive state, while output nodes 104, 110 of logic structures 102, 108, precharge in preparation for an evaluation phase. For NFET based logic structures, such as logic structures 102, 108, the inactive state is a logic low.

FIG. 3(*a*) shows a reset low pulsed latch 300 in accordance with an embodiment of the present invention. Reset low pulsed latch 300 has an input terminal IN 302, and an output terminal OUT 308. A PFET 304 and an NFET 306 are coupled in parallel between input terminal IN 302 and output terminal OUT 308. An inverter 310 is coupled, as shown in FIG. 3(*a*), such that the gate of PFET 304 and the gate of NFET 306 receive logically inverted versions of the same signal. Together, PFET 304, NFET 306, and inverter 310 form a CMOS transfer gate. Reset low pulsed latch 300 further includes NFET 312 coupled drain-to-source between output terminal OUT 308 and ground. Those skilled in the art having the benefit of this disclosure will recognize that the transfer gate function may be achieved with other circuit configurations. For example, an NFET only transfer gate can be constructed which requires less physical space but which typically cannot pass rail-to-rail voltage swings.

In operation, reset low pulsed latch 300 passes data at the beginning of the evaluate phase for a pipeline stage. After a delay, which is determined by a pulsed clock signal, the latch resets output terminal OUT 308 to the inactive state, zero in the exemplary embodiment, thus causing the data enabled complex logic gates to reset.

Figure 4A:
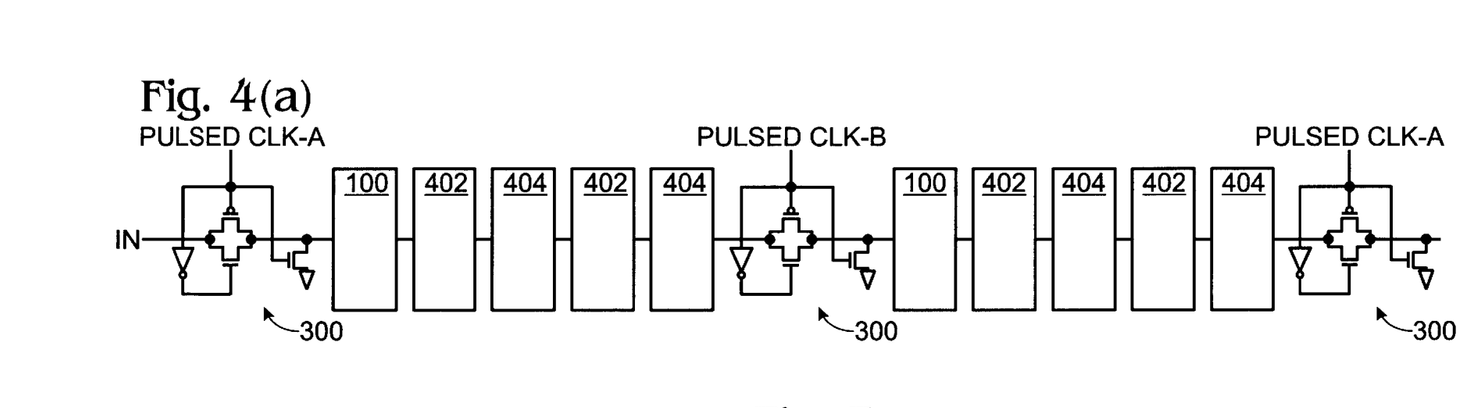
FIG. 4(a) is a schematic of a data enabled complex logic gate based pipeline structure in accordance with one embodiment of the present invention.
Figure 4B:
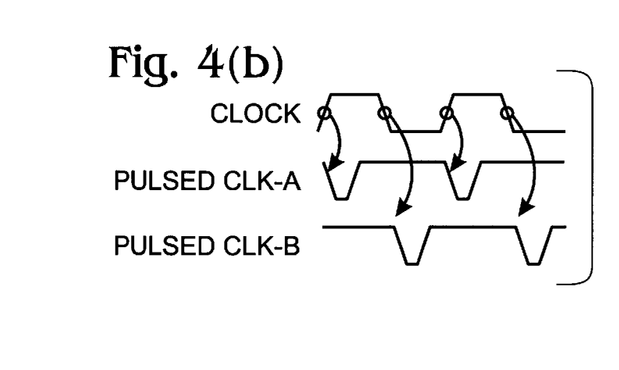
FIG. 4(b) is a timing diagram illustrating the operation of the data enabled complex logic gate based pipeline structure shown in FIG. 4(a).

Unlike latches used in domino based pipelines, latches in accordance with the present invention do not require a memory element. Since each stage operates on a different phase of the clock, and the gates in the inactive phase are holding their values, the latches driving the active phase logic only need to provide transparency. This improves circuit performance in terms of area, speed, and power dissipation. Pipelines implemented using reset low pulsed latches are made race free by ensuring that some minimal number of logic levels exists along any path connecting two latches. FIG. 4(*a*) graphically illustrates the structure of a data enabled complex logic gate based pipeline.

Referring to FIG. 3(*b*), an exemplary embodiment of a pulse controlled double edge triggered flip-flop 340 is shown. Pulse controlled double edge triggered flip-flop 340 has an input terminal 342 and an output terminal 360. Input terminal 342 is coupled to a first CMOS transfer gate 344 and a second CMOS transfer gate 346. Both first and second CMOS transfer gates 344, 346 are coupled to the same clock signal source, however, first CMOS transfer gate 344 is configured to pass data while the clock signal is at a low level, and second CMOS transfer gate 346 is configured to pass data while the clock signal is at a high level.

A first latch 348 is coupled to the output of first CMOS transfer gate 344 at node 347. An NFET 350 is coupled between node 347 and ground. The gate of NFET 350 is coupled to a first pulsed clock signal source. A second latch 352 is coupled to the output of second CMOS transfer gate 346 at node 353. An NFET 354 is coupled between node 353 and ground. The gate of NFET 354 is coupled to a second pulsed clock signal source.

Node 347 is coupled to one terminal of a CMOS transfer gate 356. As shown in FIG. 3(*b*), a second terminal of CMOS transfer gate 356 is coupled to output terminal OUT 360. Node 353 is coupled to one terminal of a CMOS transfer gate 358. A second terminal of CMOS transfer gate 358 is coupled, as shown in FIG. 3(*b*), to output terminal OUT 360. Both CMOS transfer gates 356, 358 are coupled to the same clock signal source, however, CMOS transfer gate 356 is configured to pass data while the clock signal is at a low level, and CMOS transfer gate 358 is configured to pass data while the clock signal is at a high level.

In operation, pulse controlled double edge triggered flip-flop 340 passes an input signal to its output terminal 360 on every transition of the clock signal. Therefore, new data is passed though at the start of every clock phase. This provides a data rate of 2× over that of edge-triggered flip-flops or latches receiving the same clock. After some predetermined delay the output is set to ground. This allows the internal nodes of a data enabled complex logic gate to be reset prior to the arrival of new data. Timing constraints to consider when using either reset low pulsed latch 300 or reset low pulsed double edge triggered flip-flop 340 are: (a) the period of time that the data is valid must be long enough for the data enabled complex logic gates receiving the data to evaluate; and (b) the time required for the data enabled complex logic gates to reset their internal nodes cannot exceed the difference between the data valid time and the clock phase width.

Fortunately, these two constraints are non-conflicting and are relatively easy to satisfy. Embodiments of a pipeline stage in accordance with one aspect of the present invention begin with either of a reset low pulsed latch of a reset low pulsed double edge triggered flip-flop feeding the data enabled complex logic gates. Data enabled complex logic gates, in turn, are coupled to multiplexer gates. The illustrative pipeline stage is completed by alternating conventional static and multiplexer based gates at every other logic level. FIG. 4(a) shows a pipeline in accordance with the present invention where a reset low pulsed latch is coupled to a data enabled complex gate 100, which is coupled in turn to a multiplexer gate 402. Multiplexer gate 402 is a passive logic structure such as those shown in FIGS. 2(a)–(f). The output of multiplexer gate 402 is coupled to a static logic gate 404, as shown, in FIG. 4(a). Those skilled in the art will recognize that the number of gates in a pipeline stage will be selected based on the desired frequency of operation and the complexity of the logical function that is to be implemented.

Figure 5:
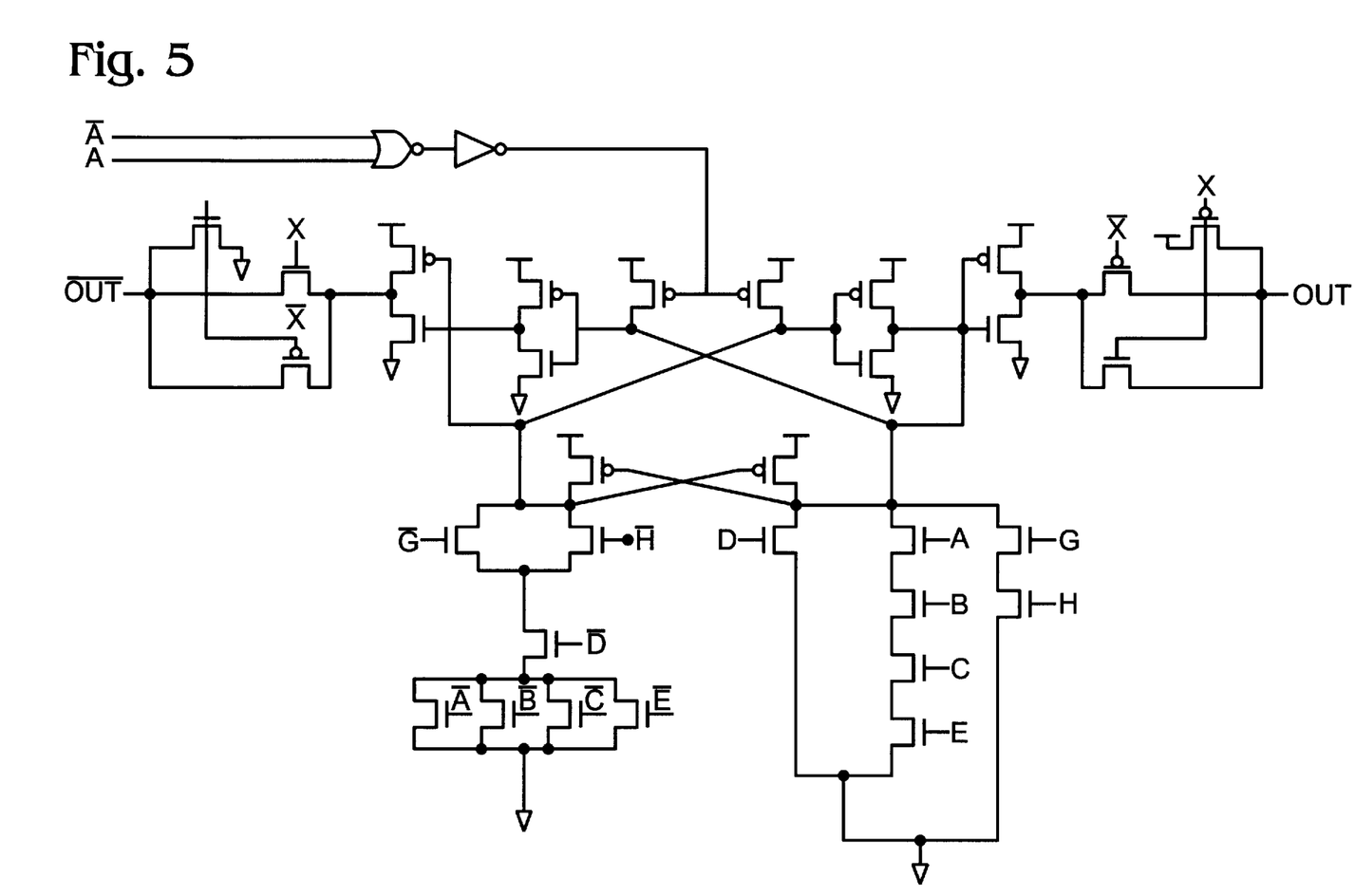
FIG. 5 is a transistor-level schematic diagram of a data enabled complex logic gate combined with multiplexer gates.

The use of multiplexer based gates after data enabled complex gates reduces the buffering delay inherent in the data enabled complex gate structure. Combined with a multiplexer gate, the worst case series resistance from either Vcc or ground to the output of the multiplexer gate is 1.5×Reff, where Reff is the effective resistance given fixed width transistors. In contrast, for a static two input gate, the worst case series resistance is 2×Reff. FIG. 5 shows the combined data enabled complex gate/multiplexer gate structure. As shown in FIG. 5, signals X and Xbar are generated by another data enabled complex gate.

Figure 6:
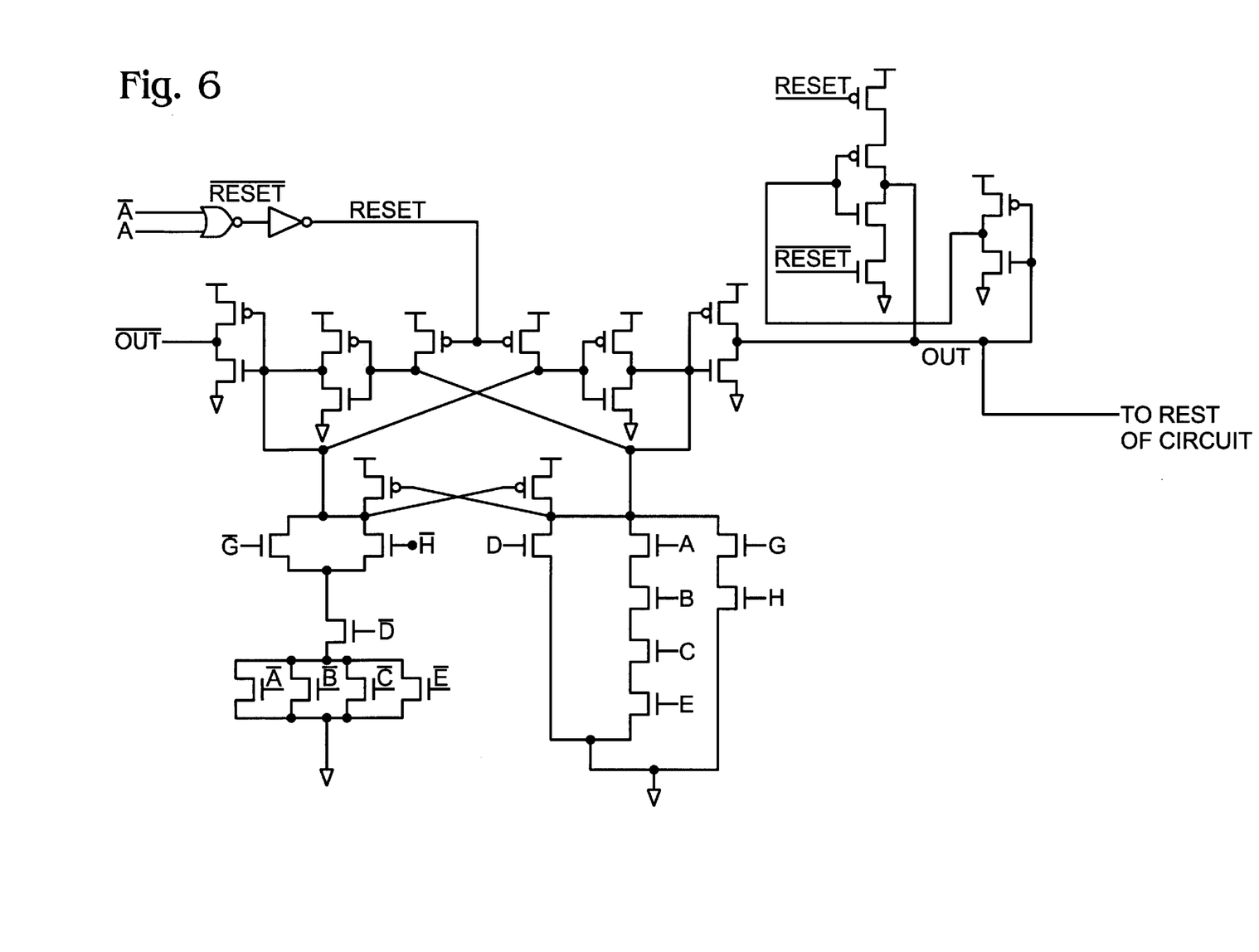
FIG. 6 is a transistor-level schematic diagram of a complex tristate latch.
Figure 7:
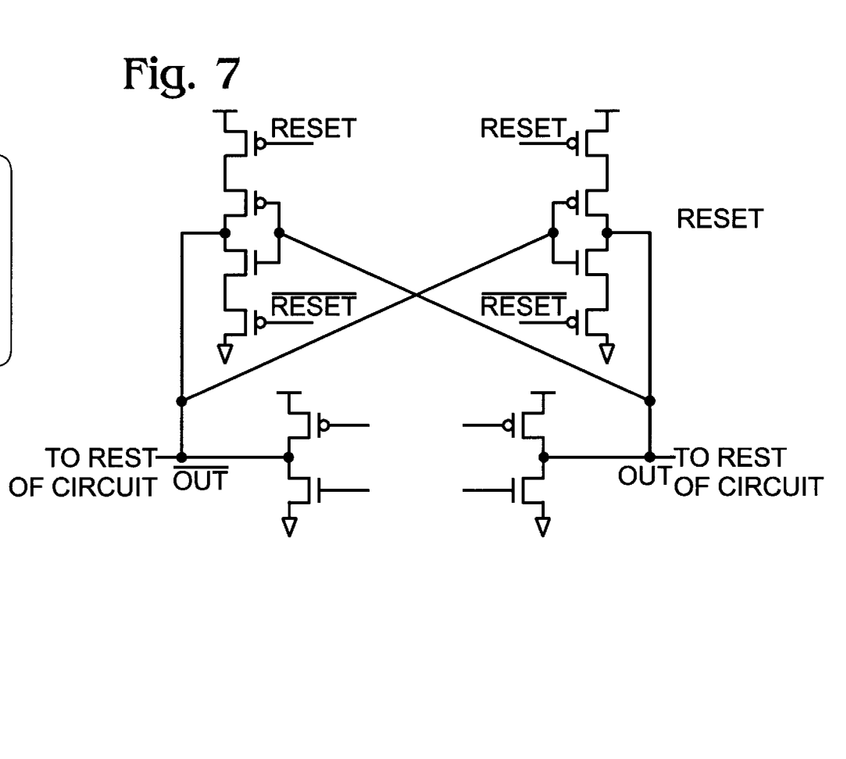
FIG. 7 is a transistor-level schematic diagram illustrating tristate cross-coupling of complex gate outputs.

One concern with a data enabled complex logic gate, is that the outputs float when the internal nodes of the data enabled complex logic gate are resetting. This situation is overcome by adding a minimum sized tristate latch on the data enabled complex logic gate output nodes. These latches are disabled while the gate is evaluating. Once reset becomes zero (i.e., the precharge signal is asserted), the latch holds the outputs. Using minimum sized transistors in the latching circuit minimizes the impact of the added capacitance at the data enabled complex logic gate output nodes. FIG. 6 shows an implementation of the tristate latch technique. Cross-coupling the outputs using tristate inverters can also be done. Doing so would eliminate two inverters per complex gate. This configuration is shown in FIG. 7.

Noise

The primarily static nature of pipeline designs in accordance with the present invention result in greater immunity to these noise problems. Moreover, the buffering structure of the data enabled complex logic gate reduces the effects of charge sharing while the cross-coupling of the complementary n-networks provides added protection against residual input noise as well as charge sharing.

Conclusion

The present invention provides high speed circuits that impose less capacitive load on the clock network than functionally equivalent domino based circuits.

Embodiments of the present invention allow large CMOS gates to be constructed which have an improved tolerance for charge sharing. This is a distinct advantage over domino and current switch based circuit topologies, where charge sharing problems result in unreliable operation of large gates.

Alternative embodiments of the present invention include multiplexer based transmission gate logic for further circuit speed-up.

In a further aspect of the present invention, pipeline structures using data enabled complex gates preserve the data produced by inactive pipeline stages. This allows the use of simpler latching elements between stages, when compared with domino based schemes, providing even further speed-up. Pipeline circuits in accordance with the present invention are compatible with block disabling techniques, since disabled datapath segments are required to retain their values when the latches that feed them are not clocked (opened).

It will be understood that various other changes in the details, materials, and arrangements of the parts and steps which have been described and illustrated in order to explain the nature of this invention may be made by those skilled in the art without departing from the principles and scope of the invention as expressed in the subjoined claims.

What is claimed is:

1. A circuit comprising:
   a first logic structure having a first output node;
   a second logic structure having a second output node;
   a first buffer having input terminals coupled to the output nodes of both the first and second logic structures and having a first buffer output node;
   a second buffer having input terminals coupled to the output nodes of both the first and second logic structures and having a second buffer output node; and
   a precharger coupled between a voltage supply node and the first and second output nodes;
   wherein the first and second buffers are configured to selectively provide a logic high output, a logic low output, and a dynamic storage node when the precharger is active.

2. The data enabled complex logic gate of claim 1, further comprising:
   a first pull-up coupled to the first output node; and
   a second pull-up coupled to the second output node.

3. The circuit of claim 2, wherein the first pull-up is a first PFET coupled source-to-drain between a voltage supply node and the first output node, the second pull-up is a second PFET coupled source-to-drain between a voltage supply node and the second output node.

4. The circuit of claim 3, wherein the gate of the first PFET is coupled to the second output node and the gate of the second PFET is coupled to the first output node.

5. A complex logic gate, comprising:

a first logic structure having a first output node;

a second logic structure having a second output node;

a precharger coupled between a first power supply node and the first and second output nodes; and a first dynamic storage node switchably coupled to the first and second output nodes by a first circuit;

wherein the first circuit comprises a first switchable conductive pathway having a first control terminal, the first control terminal coupled to the first output node; a second switchable conductive pathway having a second control terminal, and an inverting logic gate coupled between the second control terminal and the second output node.

6. The complex logic gate of claim 5, further comprising:

a second dynamic storage node switchably coupled to the first and second output nodes by a second circuit;

wherein the second circuit comprises a third switchable conductive pathway having a third control terminal, the third control terminal coupled to the second output node; a fourth switchable conductive pathway having a fourth control terminal, and an inverting logic gate coupled between the fourth control terminal and the first output node.

7. The complex logic gate of claim 6, wherein the switchable conductive pathways are field effect transistors.

* * * * *